United States Patent
Awalt

(10) Patent No.: US 8,161,365 B1
(45) Date of Patent: Apr. 17, 2012

(54) CYCLIC REDUNDANCY CHECK GENERATOR

(75) Inventor: Rockland K. Awalt, Garden Valley, CA (US)

(73) Assignee: Xilinx, Inc., San Jose, CA (US)

( * ) Notice: Subject to any disclaimer, the term of this patent is extended or adjusted under 35 U.S.C. 154(b) by 730 days.

(21) Appl. No.: 12/363,699

(22) Filed: Jan. 30, 2009

(51) Int. Cl.
*G06F 11/10* (2006.01)
*H03M 13/00* (2006.01)

(52) U.S. Cl. .......... 714/807; 714/758; 714/781

(58) Field of Classification Search .......... 714/758, 714/781, 807; 708/490
See application file for complete search history.

(56) References Cited

U.S. PATENT DOCUMENTS

| | | |
|---|---|---|
| 2005/0010630 A1* | 1/2005 | Doering et al. ............. 708/490 |
| 2005/0154960 A1* | 7/2005 | Sydir et al. ............. 714/758 |
| 2008/0092020 A1* | 4/2008 | Hasenplaugh et al. ....... 714/781 |
| 2010/0058154 A1* | 3/2010 | Sezer et al. ............. 714/807 |

OTHER PUBLICATIONS

U.S. Appl. No. 12/059,773, filed Mar. 31, 2008, Schultz et al.

\* cited by examiner

*Primary Examiner* — Sam Rizk
(74) *Attorney, Agent, or Firm* — W. Eric Webostad

(57) ABSTRACT

A cyclic redundancy check ("CRC") generator and method therefor are described. Checksum bits and checksum enable bits are bitwise ANDed to provide interim checksum outputs. The interim checksum outputs are XORed to provide resultant checksum outputs. Data bits and data enable bits are bitwise ANDed to provide interim data outputs. The interim data outputs are XORed to provide resultant data outputs. The resultant checksum outputs and the resultant data outputs are bitwise XORed to provide parity outputs.

14 Claims, 9 Drawing Sheets

601-0
DOUT[0]=(D127&ED127)^(D126&ED126)^...(D1&ED1)^(D0&ED0)

•
•
•

601-31
DOUT[31]=(D127&ED127)^(D126&ED126)^...(D1&ED1)^(D0&ED0)

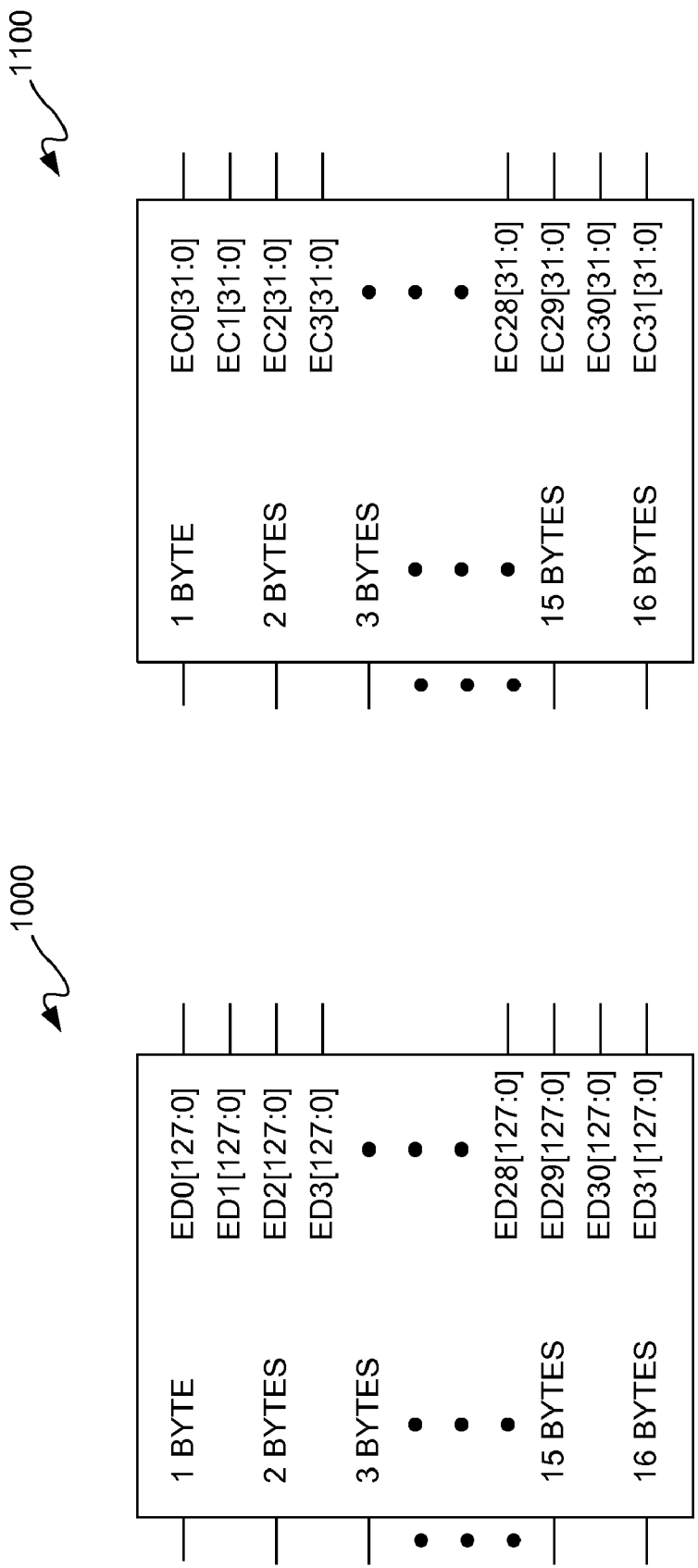

CYCLIC REDUNDANCY CHECK GENERATOR

FIELD OF THE INVENTION

The invention relates to integrated circuit devices ("ICs"). More particularly, the invention relates to a cyclic redundancy check ("CRC") generator for an IC.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Cyclic redundancy check ("CRC") logic may be implemented for a variety of data widths. Conventionally, a CRC generator implemented a separate version of CRC logic for each data width and then selected a data width of interest by use of a multiplexer. Such a conventional CRC generator thus used a substantial amount of circuit resources and was slowed by a multiplexer boundary.

SUMMARY OF THE INVENTION

One or more aspects generally relate to integrated circuit devices ("ICs") and, more particularly, to a cyclic redundancy check ("CRC") generator for an IC.

An aspect relates generally to a method for error checking. Checksum bits and checksum enable bits are bitwise ANDed to provide interim checksum outputs. The interim checksum outputs are XORed to provide resultant checksum outputs. Data bits and data enable bits are bitwise ANDed to provide interim data outputs. The interim data outputs are XORed to provide resultant data outputs. The resultant checksum outputs and the resultant data outputs are bitwise XORed to provide first parity outputs.

Another aspect relates generally to a circuit for cyclic redundancy checking. The circuit includes an input data bus coupled to cyclic redundancy check ("CRC") blocks. Each of the CRC blocks is coupled to receive all bits of the input data bus. A checksum bus is coupled to the CRC blocks. Each of the CRC blocks is coupled to receive all bits of the checksum bus. An activation logic block is configured responsive to a CRC format. The activation logic block is coupled to receive a width vector and configured to activate and deactivate enable bits of enable buses responsive to the width vector and the CRC format. The activation logic block sources the enable buses responsive to bit position. Each of the enable buses has different bit settings for respectively providing to the CRC blocks according to bit position. The CRC blocks are each a logical replica of one another.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIGS. 10 and 11 are block diagrams depicting exemplary embodiments of an enable data function generator and an enable checksum function generator, respectively, located in an activation logic block of the CRC generator of FIG. 3

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
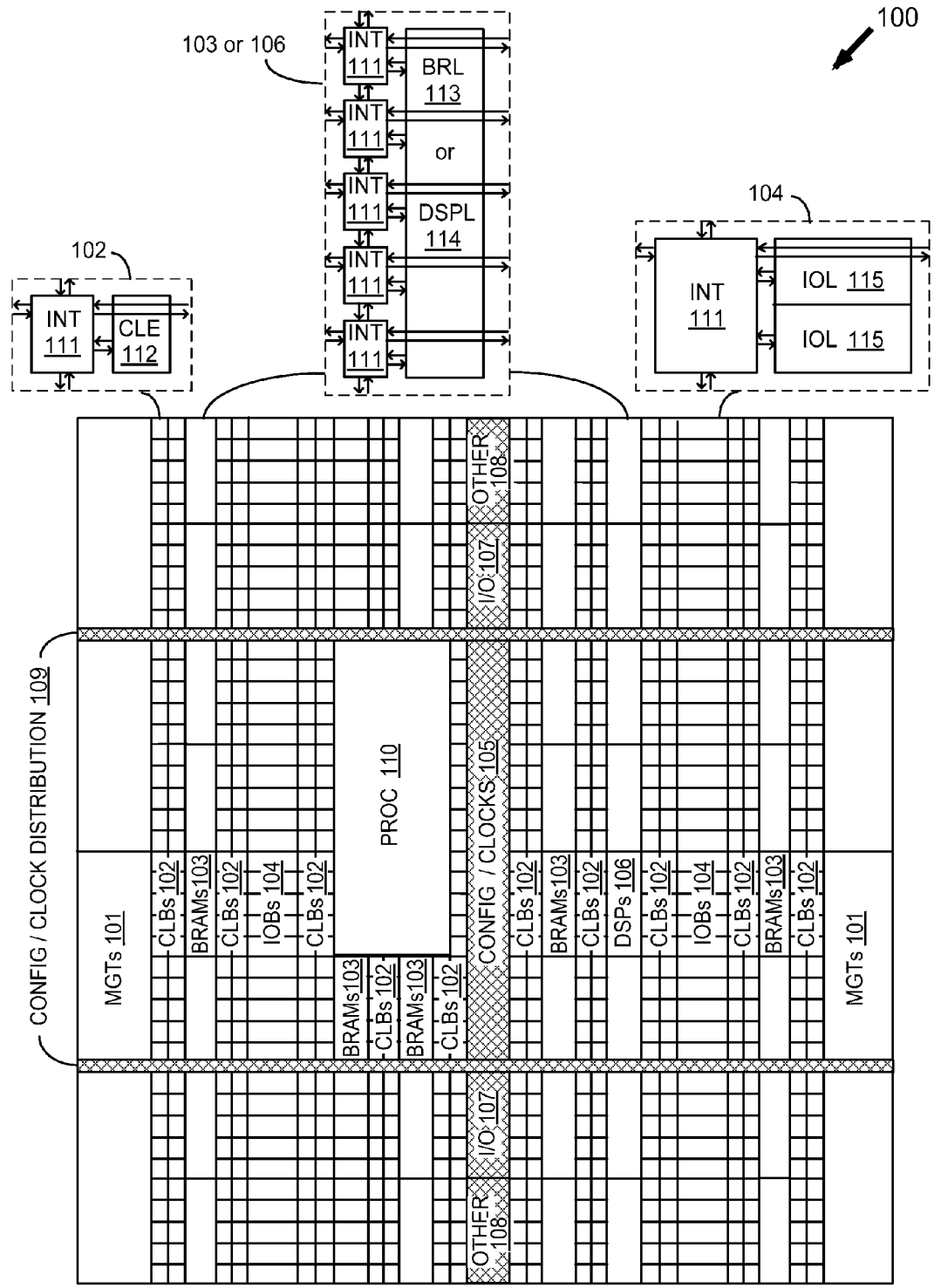
FIG. 1 is a block diagram depicting an exemplary embodiment of a columnar Field Programmable Gate Array ("FPGA") architecture in which one or more aspects of the invention may be implemented.

As noted above, an advanced FPGA, a complex type of integrated circuit, can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a columnar area near the center of the die (shown in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 2:
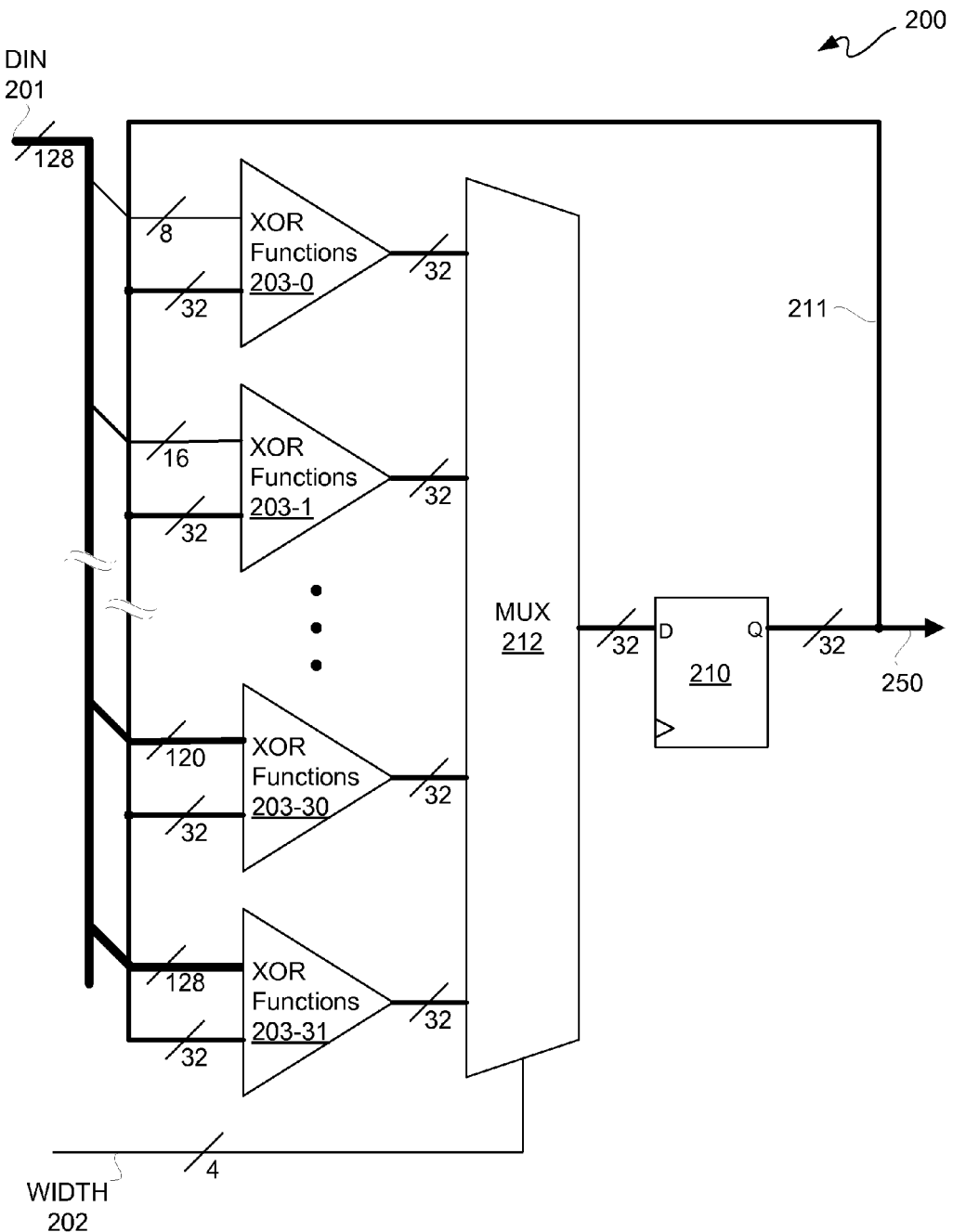
FIG. 2 is a circuit/block diagram depicting a cyclic redundancy check ("CRC") generator of the prior art.

Referring to FIG. 2, there is shown a circuit diagram depicting a CRC generator 200 of the prior art. CRC generator 200 can receive up to a 128-bit wide data input bus 201. The term bus is used herein to indicate either or both signals and physical connections. Eight bits or one byte of such data input is provided as input to 32 1-byte equations implemented as exclusive-OR ("XOR") functions 203-0. Two bytes or 16 bits of data input bus 201 is input to 32 2-byte equations implemented as XOR functions 203-1, and so on. This progressive tapping of data input bus 201 in 1-byte increments progresses on down to XOR functions 203-30, which is capable of receiving 120 bits of data input bus 201 to 32 15-byte equations, and then to XOR functions 203-31, which is capable of receiving all 128 bits of data input bus 201 to 32 16-byte equations. It should be understood that XOR functions 203 are conventionally implemented entirely with XOR gates.

XOR functions 203-0 through 203-31 provide their respective outputs to multiplexer 212, which selects one such output for passing to flip-flop 210. Flip-flop 210 provides parity output result 250. Output of flip-flop 210 is also provided as a feedback input of checksum bits, namely checksum feedback input 211, to each of XOR functions 203-0 through 203-31. Checksum feedback input 211 in this exemplary embodiment is a 32-bit-wide output, and each of such 32 bits is provided as a separate 32-bit input to each of XOR functions 203-0 through 203-31. XOR functions 203-0 through 203-31 provide bitwise XORing of respective byte input from data input bus 201 with feedback output from flip-flop 210. Even though only a single flip-flop 210 is illustratively depicted, it should be understood that flip-flop 210 represents multiple flip-flops, namely 32 flip-flops for this depicted exemplary embodiment.

In this example, data width input 202 is a four bit input or 4-bit width input. A 1-, 2-, . . . , 15-, or 16-byte data width may be dynamically selected responsive to width input 202. Width input 202 is provided as a control select to multiplexer 212. Each of the 32-bit wide outputs of XOR functions 203-0 through 203-31 are provided as a separate input to multiplexer 212, and one of such 16 inputs for this embodiment is selected responsive to width input 202. For this embodiment, multiplexer 212 is a 32-by-16-to-1 multiplexer.

Multiplexer 212 and XOR functions 203-0 through 203-31 consume a significant amount of circuitry. For this embodiment, thirty-two equations for 16 possible data widths equals 512 equations, or 512 XOR functions. Implementation of 512 XOR functions in FPGA 100 of FIG. 1 using 6-input LUTs may consume significantly in excess of 4,000 6-input LUTs. Furthermore, multiplexer 212 may be implemented with approximately 160 multiplexer LUTs.

Figure 3:
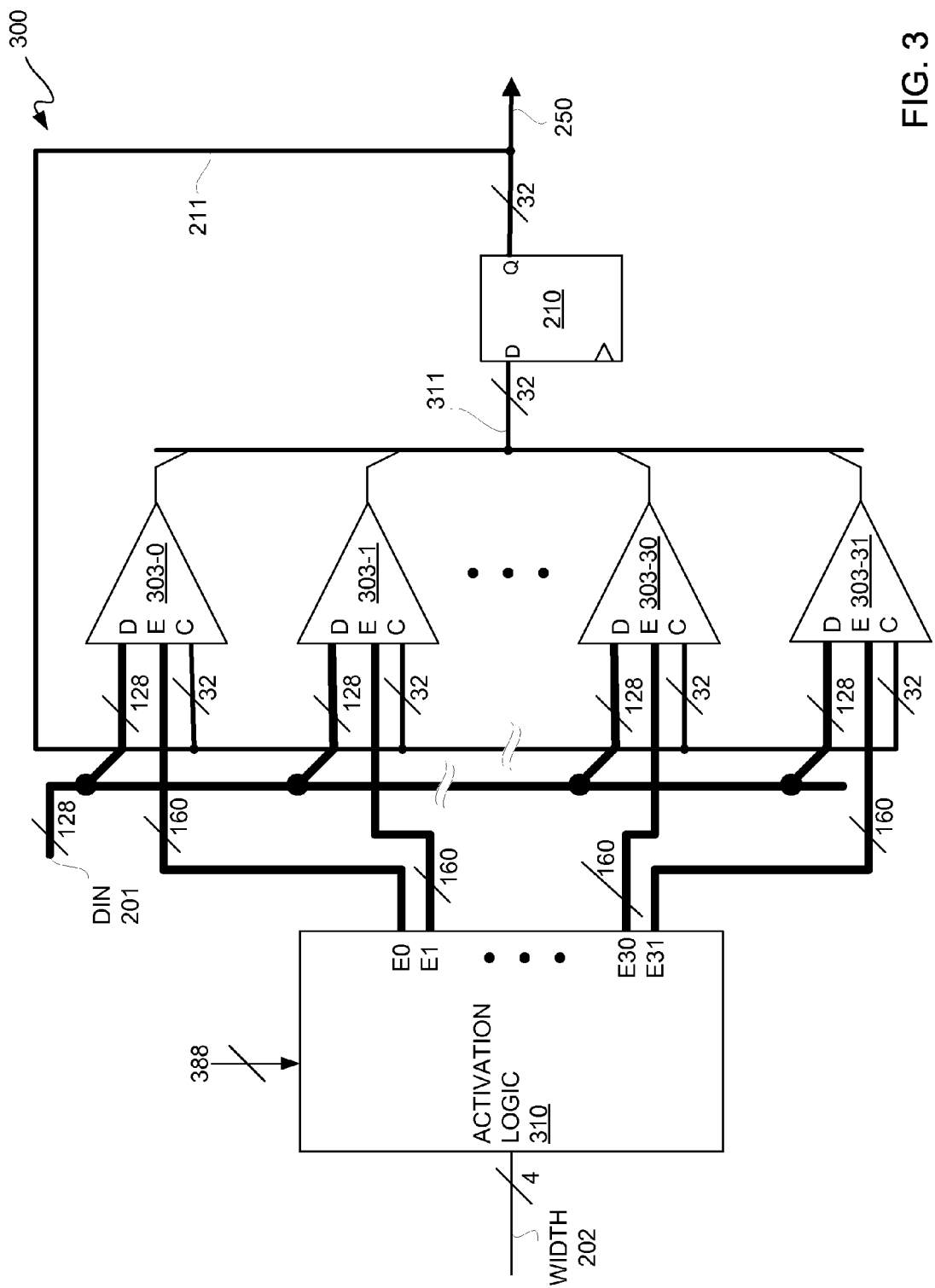
FIG. 3 is a circuit/block diagram depicting an exemplary embodiment of a CRC generator 300.

FIG. 3 is a circuit/block diagram depicting an embodiment of a CRC generator 300 that is implementable in an integrated circuit. CRC generator 300, in addition to being able to operate at relatively higher operating speeds than CRC generator 200 of FIG. 2, uses relatively less logic measured in terms of LUTs of FPGA 100 of FIG. 1 as compared with CRC generator 200 of FIG. 2. Furthermore, because a multiplexer stage is avoided, CRC generator may be more suitable for pipelining, and more particularly pipelining with fewer register stages, than CRC generator 200 of FIG. 2. For purposes of clarity by way of example and not limitation, numerical values, for example numerical examples of width input 202 and data input bus 201, are provided for purposes of comparison with the embodiment depicted in FIG. 2; however, it should be appreciated that other numerical values may be used.

Width input 202 is provided as an input to activation logic block 310. Activation logic block 310 provides a plurality of activation signals, which in this exemplary embodiment are depicted as activation ("enable") buses E0 through E31 for a total of 32 of such signals. It should be understood that implementation of activation logic block 310 is dependent upon application, for example depending upon a CRC polynomial selected, as a provided polynomial input 388 to activation logic 310, for a CRC check. Bit values of buses E0 through E31 thus are different from one another, although all of such signals have a data portion and a checksum portion, as described below in additional detail. Even though polynomial selection as described herein is assumed to be generally static during operation for purposes of clarity, it should be understood that polynomial selection alternatively may be dynamic, namely performed during operation of CRC generator 300 as a polynomial input 388 to activation logic 310.

CRC and CRC polynomials are well known, and thus CRC and CRC polynomials not described in unnecessary detail for purposes of clarity. More information regarding CRC and CRC polynomials may be found for example at http://en.wikipedia.org/wiki/Cyclic_redundancy_check. Thus, even though the example of a 32-bit polynomial is used, it should be understood that other CRC polynomials and bit sizes may be used. Thus, activating/deactivating bits responsive to bit positions as associated with CRC logic cones, described below in additional detail, should be understood. It should further be understood that responsive to a width vector input, the set or a subset of enable data and checksum bits are going to be active or inactive on each of enable buses E0 through E31. It should further be understood that a fixed bit pattern, which is responsive to CRC polynomial implemented and which is generally subsequently XORed after output from activation logic block 310, is different for each of enable buses E0 through E31.

In contrast to activation logic block 310, equations implemented in logic blocks or cones 303-0 through 303-31 are all the same. In other words, each cone 303 has the same circuit, and thus cones may be easily replicated for scaling.

Each of cones 303 is coupled to receive all 128 bits of data input bus 201. Bus E0 is provided as an input to cone 303-0, and likewise buses E1 through E31 are respectively provided as inputs to cones 303-1 through 303-31. Each of buses E0 through E31 in this example has a 160-bit width, namely 128 enable data bits and 32 enable checksum bits. Feedback input 211 sourced from the output of flip-flops 210, from which parity output result 250 may be obtained, is provided as a feedback input to each of cones 303-0 through 303-31. Parity output result 250 may be used for error checking. Again, feedback input 211 is checksum bits.

Thus, each of cones 303-0 through 303-31 receives the same set of data and the same set of checksum bits. However, each of cones 303-0 through 303-31 receives a respective bus E0 through E31, which are different from one another with respect to bit values. Furthermore, not all bit positions of enable data for buses E0 through E31 may be active depending on the size of data selected, namely the bit width of data on data input bus 201 to be used as dynamically selected responsive to width input 202. In this example, width input 202 may indicate a bit width from 1 to 16 bytes in one byte increments for selection of data on data input bus 201.

It should be understood rather than using a multiplexer as illustratively depicted for CRC generator 200 for selecting one of up to 16 sets of 32 CRC equations, or in other words essentially performing a parity check on selected data and accumulated CRC bits, CRC generator 300 configures one set of 32 equations to calculate parity on up to 16 different sets of selected data and accumulated CRC bits. While the example of 16 different sets of data is used as an upper bound, it should be appreciated that a wide variety of data widths may be used and is not limited to this specific example. Furthermore, polynomials which are less or greater than the 32-bit polynomials depicted, as generally indicated by a 32-bit width of checksum feedback input 211, may be used, as well as other remainder options than those generally indicated. It should be understood that CRC generator 300 may be implemented in either dedicated logic or field programmable logic gates, or both. For dedicated logic, an optimization of CRC generator 300 may optionally be performed prior to committing the design thereof to dedicated logic. Thus, the hierarchical topology depicted may be tailored to the application, where synthesis tools may be used for trimming or scaling up the depicted embodiment.

It should be appreciated that activation logic block 310 may generate constants and thus there may be a minimization or reduction of logic associated therewith for implementation of cones 303-0 through 303-31. However, even without such minimization or reduction, the total number of gate input loads of cones 303-0 through 303-31 is approximately less than half of the total number for CRC generator 200 of FIG. 2. For example, using the numerical examples described herein with respect to FIGS. 2 and 3, there may be approximately 10,000 input loads (i.e., (128+160+32)×32=10,240) for CRC generator 300 as compared with an estimate of approximately 23,000 XOR input loads for CRC generator 200 of FIG. 2. It should be understood that for this embodiment of CRC generator 300 there are 5,280 signals into the set of cones 303-0 through 303-31 (e.g., 128+32+(160×32)), but there are 10,240 cone loads.

Width input 202 may be dynamically set as it was for CRC generator 200 of FIG. 2, but instead of using width input 202 as a control select signal to a multiplexer, width input 202 is used to control the 32 buses E0 through E31 via activation logic block 310.

Again, it should be appreciated that all equations implemented via cones 303-0 through 303-31 are the same. In other words, various byte widths may be accommodated using only one set of 32 equations for the depicted embodiment, where each of logic cones 303-0 through 303-31 has the same set of 32 equations. Thus, the respective enable inputs provided via buses E0 through E31 differentiate the output of each of cones 303-0 through 303-31. Outputs of cones 303-0 through 303-

31 as described below in additional detail, form an input bus 311 for a 32-bit wide input to output flip-flops 210.

Figure 4:
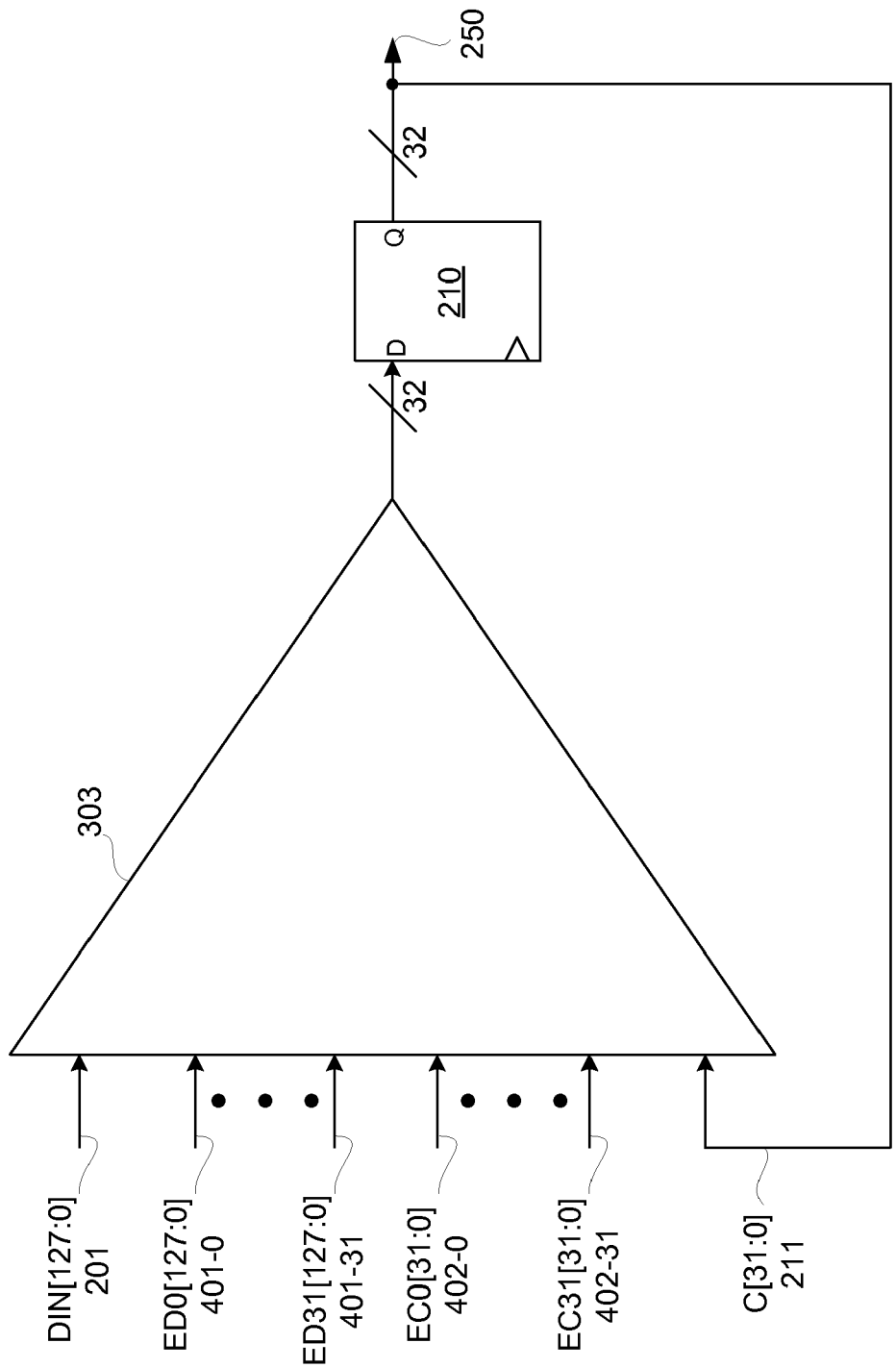
FIG. 4 is a circuit/block diagram depicting an exemplary embodiment of a portion of the CRC generator of FIG. 3 with data and checksum buses.

Referring to FIG. 4, there is shown a circuit/diagram depicting an exemplary embodiment of a portion of CRC generator 300 of FIG. 3 with enable data and checksum buses. For purposes of clarity, cones 303 have been generalized as a single cone. Data input bus 201, which in this example is up to 128 bits or 16 bytes, is input along with checksum feedback input ("checksum bus") 211, as previously described. Enable buses E0 through E31 have been broken up into their data and checksum constituents, namely enable data 0 ("ED0") through enable data 31 ("ED31") buses 401-0 through 401-31 and enable checksum 0 ("EC0") through enable checksum 31 ("EC31") 402-0 through 402-31.

In this embodiment, enable data buses 401-0 through 401-31 are each 128 bits wide, and enable checksum buses 402-0 through 402-31 are each 32 bits wide buses. Thus, for example, enable bus E0 of FIG. 3 is split up into enable data 0 bus 401-0 and enable checksum 0 bus 402-0. Enable data buses, of which there are 32, form 4,096 bits in this exemplary embodiment, and enable checksum buses, also of which there are 32, form 1,024 bits. Thus, there are total of 5,120 enable bits from activation logic 310 into logic cones 303.

Enable data bits are logically combined, for example using AND gates, with data bits, and enable checksum bits are logically combined, for example using AND gates, with checksum bits. Thus, data input 201 is bitwise, namely bit-by-by according to being in a same bit position, ANDed with each of enable data buses 401-0 through 401-31, and checksum bus 211 bits are bitwise ANDed with each of enable checksum buses 402-0 through 402-31.

Figures 5, 6:
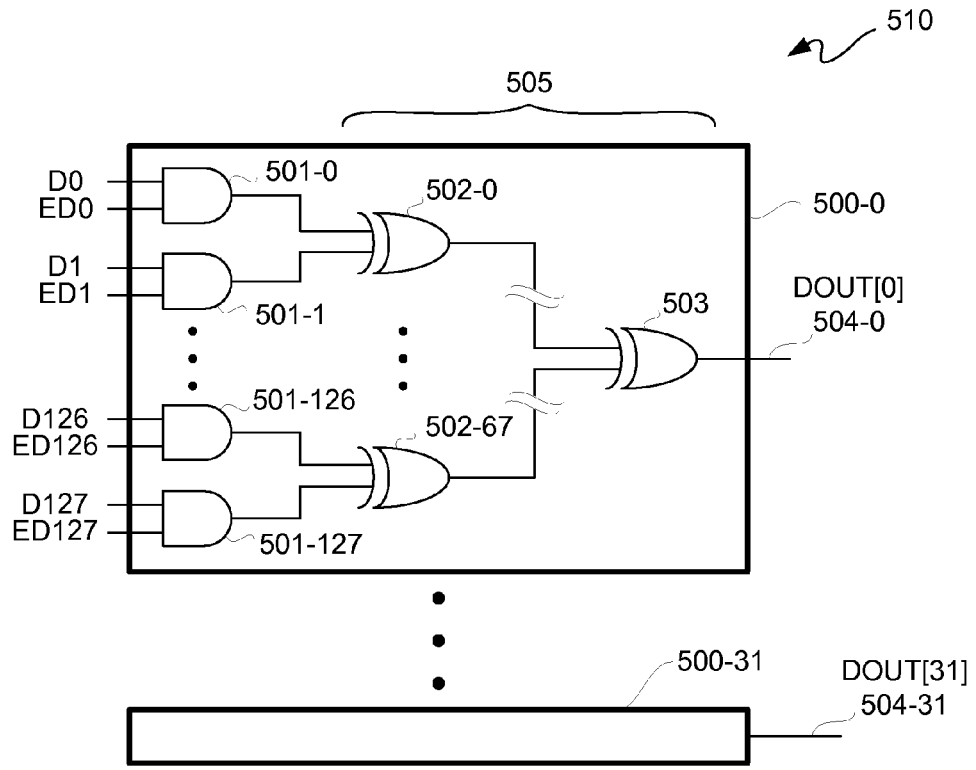
FIG. 5 is a circuit/block diagram depicting an exemplary embodiment of a data portion of logic cones/blocks of the CRC generator of FIG. 3.
FIG. 6 is a listing depicting an exemplary embodiment of a series of Boolean equations corresponding to the data portion of FIG. 5.

FIG. 5 is a circuit/block diagram depicting an exemplary embodiment of a data portion 510 of cones 303 of FIG. 3. Data portion 510 is further described with reference to both FIGS. 3 and 5.

Data portion 510 includes blocks 500-0 through 500-31 corresponding to logic cones 303-0 through 303-31. For purposes of clarity by way of example and not limitation, only data block 500-0 is shown in detail, as each of data blocks 500-0 through 500-31 is the same. AND gate 501-0 receives data at bit position zero ("D0") from data input bus 201 and receives enable data at enable data bit position zero ("ED0") from bus E0. Output of AND gate 501-0 is provided to a first level of a hierarchical XOR tree, namely XOR gate 502-0. Likewise, AND gate 501-1 receives as input D1 and ED1, and output of AND gate 501-1 is provided to XOR gate 502-0. Thus, an AND gate input level or stage, composed of AND gates 501, receives input data and enable data bits as inputs where such bits are of the same bit positions for ANDing.

Outputs of pairs of adjacent AND gates are provided as inputs to a first level of a first level of an associated XOR gate of an XOR gate tree 505. Even though an XOR gate tree is illustratively depicted for purposes of clarity, it should be understood that a single relatively large XOR gate may be used. Thus, outputs of AND gates 501-126 and 501-127 are inputs to XOR gate 502-67. Outputs of XOR gates 502 are fed up XOR gate tree 505 ultimately to an XOR gate 503 for producing data output bits 504. Thus, block 500-0 outputs one data output bit for a bit position 0 ("DOUT[0]"), and so on down through to block 500-31, which outputs one data output bit for a bit position 31 ("DOUT[31]"). Accordingly, it should be understood that collectively blocks 500-0 through 500-31 may generate a 32-bit data output 504.

Data input bus 201, which in this exemplary embodiment is a 128-bit data bus that goes to all 32 cones, is provided to each block 500 such that each block 500 can receive all 128 bits from data input bus 201. Likewise, an enable data bus of 128 bits is provided to each of blocks 500 such that each of such blocks 500 receives all 128 bits of such enable data bus. Again, bitwise ANDing is between data input bus 201 and each data portion of enable buses E0 through E31.

Referring to FIG. 6, generally Boolean equations 601-0 through 601-31 corresponding to blocks 500-0 through 500-31 of FIG. 5 are illustratively depicted. In other words, blocks 500 may be mathematically expressed as indicated by equations 601

Figure 7:
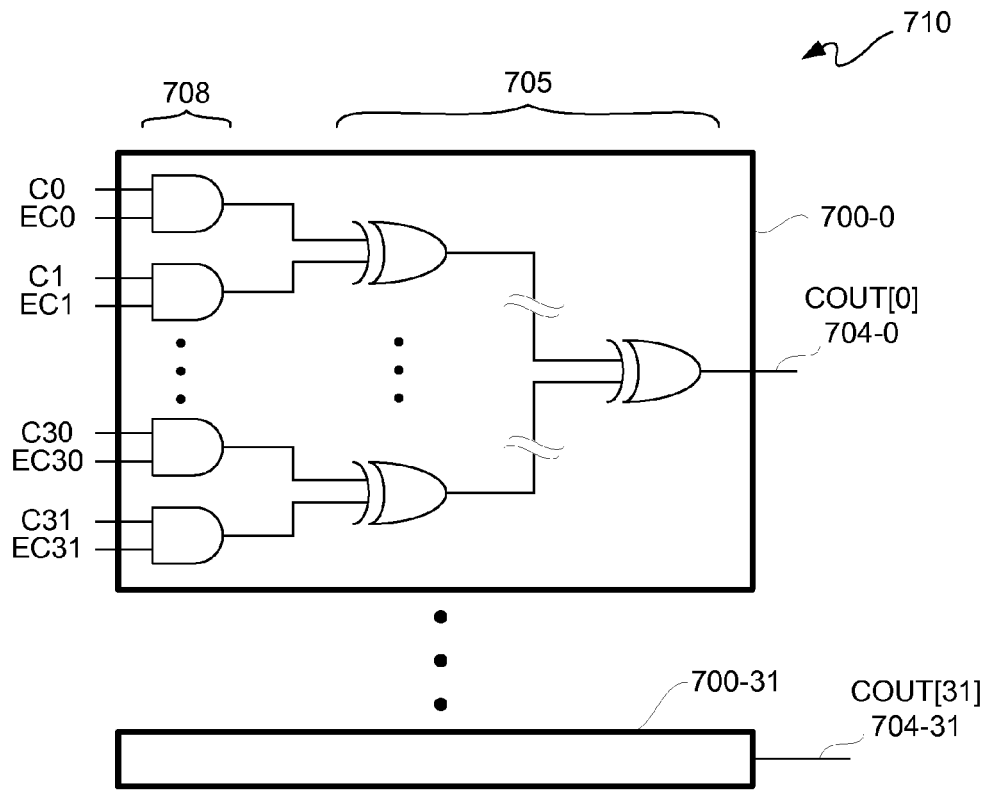
FIG. 7 is a circuit diagram depicting an exemplary embodiment of a checksum portion of logic cones/blocks of the CRC generator of FIG. 3.

Referring to FIG. 7, there is shown a circuit diagram depicting an exemplary embodiment of a checksum portion 710 of cones 303 of FIG. 3. Checksum portion 710 is similar to data portion 510 of FIG. 5, except that rather than data bits, checksum bits C0 through C31 are provided to each block 700, and enable checksum bits EC0 through EC31 are provided instead of enable data bits. Furthermore, it should be understood that the checksum bus is substantially smaller in bit width, namely a 32-bit bus in this depicted exemplary embodiment, than the data bus, which is a 128-bit bus in this depicted exemplary embodiment.

Figure 8:
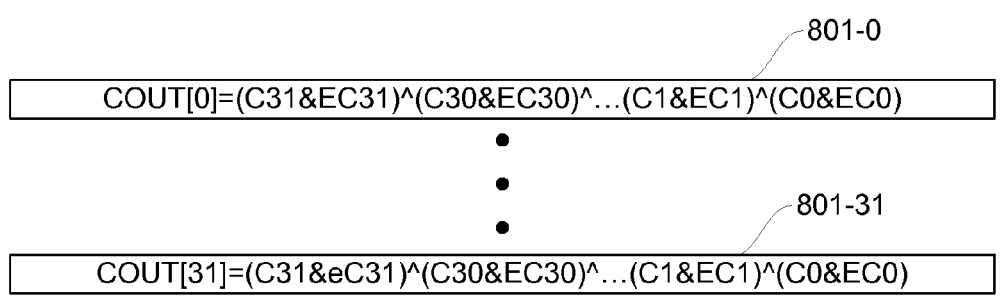
FIG. 8 is a listing depicting an exemplary embodiment of a series of Boolean equations corresponding to the checksum portion of FIG. 7.

Checksum and enable checksum bits are initially multiplied in a Boolean sense at AND gate level 708 followed by a hierarchal XOR tree 705 for each of blocks 700-0 through 700-31. Each of blocks 700-0 through 700-31 produces a one-bit output, namely respectively COUT[0] 704-0 through COUT[31] 704-31. Logic of blocks 700-0 through 700-31 may be mathematically expressed generally in Boolean terms as indicated in equations 801-0 through 801-31 of FIG. 8.

Checksum bits C0 through C31 are obtained from checksum bus 211 of FIG. 3, which is a single 32-bit checksum bus that is provided to each of blocks 700 such that each of those blocks or cones receive all 32 checksum bits of checksum bus 211. Enable checksum bits EC0 through EC31 are obtained from an enable checksum bus portion of an enable bus of activation logic 310. For example, as described above with respect to FIG. 4, enable bus E0 has a data bus portion of a 128-bit width and a checksum bus portion of 32-bit width. The data bus portion is coupled for receipt by blocks 500 and the checksum bus portion is coupled for receipt by blocks 700.

Thus, there are 32 enable checksum buses of enable bus E0 through E31, and thus there is a separate enable checksum bus for each cone as previously described with reference to FIG. 3. Accordingly, bitwise ANDing is between checksum bus 211 and each checksum portion of enable buses E0 through E31. EC0 through EC31 of enable bus E0 provided to block 700-0 is not the same as EC0 through EC31 of enable bus E31 provided to block 700-31 with respect to the bit values respectively thereof.

Figure 9:
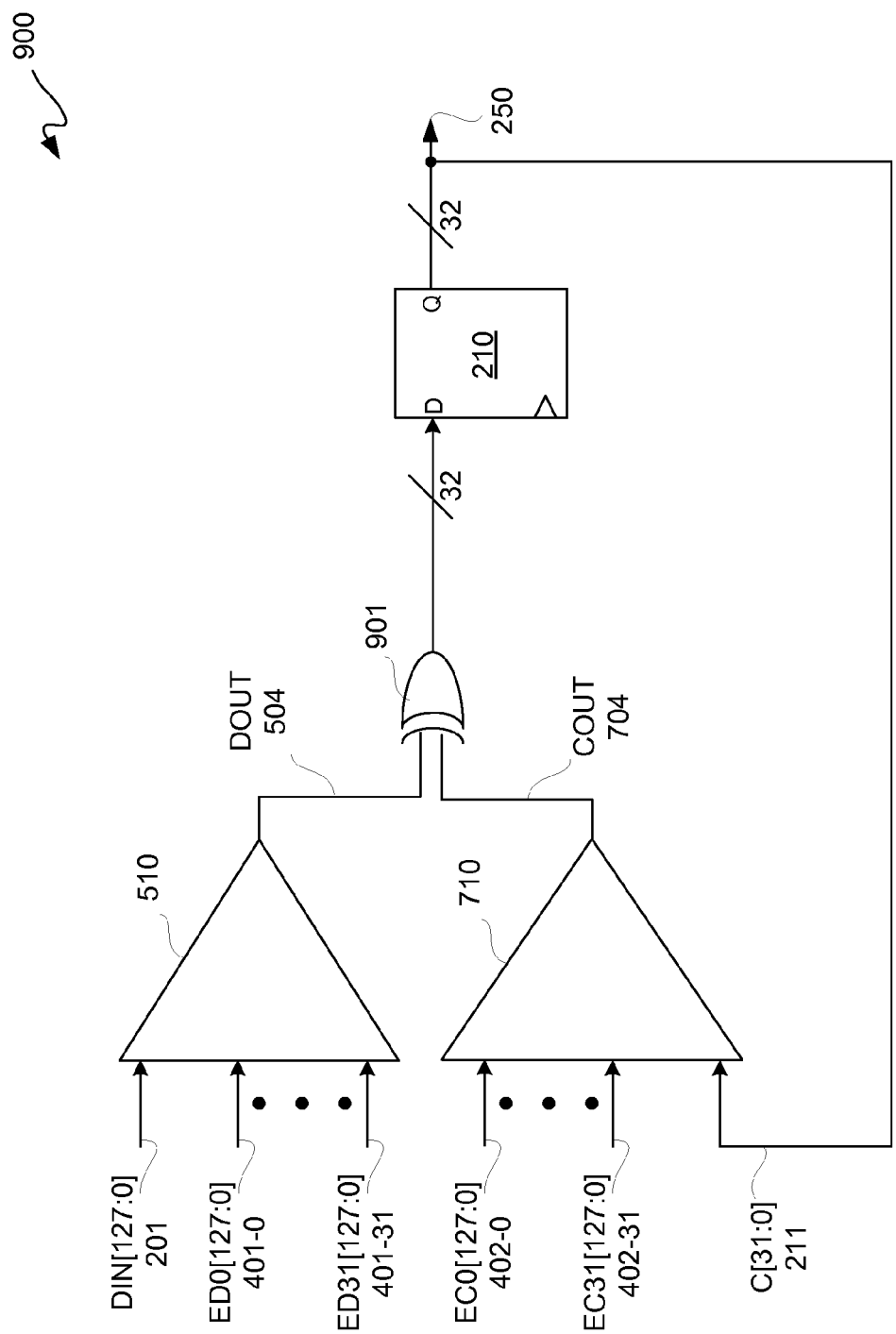
FIG. 9 is a block/circuit diagram depicting an exemplary embodiment of a portion of the CRC generator of FIG. 3 with data and checksum portions separated out.

FIG. 9 is a block/circuit diagram depicting an exemplary embodiment of a portion 900 of CRC generator 300 of FIG. 3. Cones 303 of FIG. 3 may be generalized into data sub-cones, namely data sub-cone 510 and a checksum sub-cone 710.

Data sub-cone 510 receives data from data input 201 and enable data buses 401-0 through 401-31 for generating data output ("DOUT") 504. Checksum sub-cone 710 receives input from checksum bus 211 and enable checksum buses 402-0 through 402-31 for generating checksum output ("COUT") 704.

Data output 504 is bitwise XORed with checksum output 704 by XOR gates 901. For this exemplary embodiment, 32 XOR gates may be implemented for XOR gates 901 even though a single XOR gate is illustratively depicted for purposes of clarity. Thus, for example, DOUT[0] bit 504-0 is XORed with COUT[0] bit 704-0. Accordingly, each of bit positions 0 through 31 are XORed as between their data and checksum counterparts. In this exemplary embodiment, XOR gates 901 generate 32 bits for flip-flops 210.

To recapitulate, it should be appreciated that there is one data input bus that goes to all data cones and one checksum bus that goes to all checksum cones. There is a separate enable data bus for each data cone, and there is a separate enable checksum bus for each checksum cone.

Figure 12:
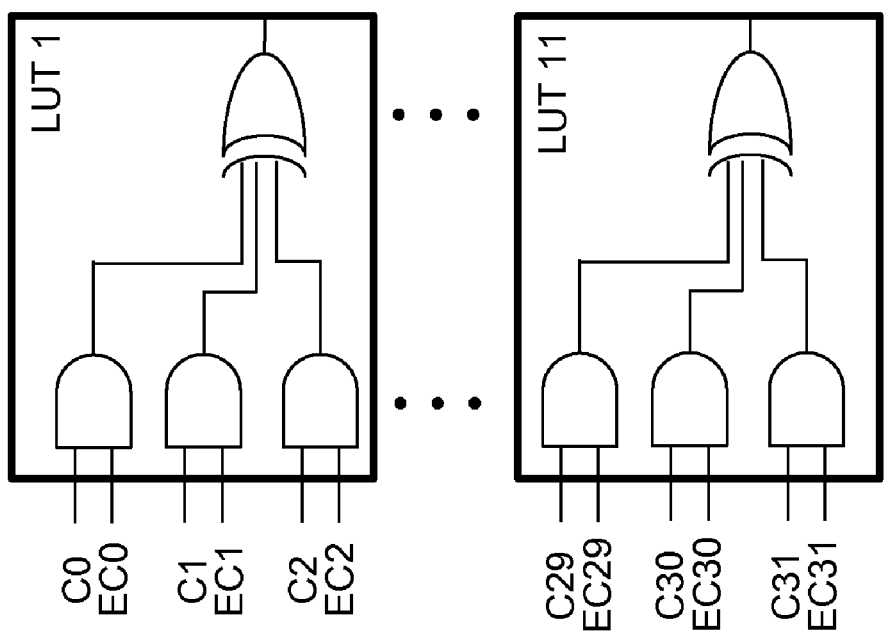
FIG. 12 is block diagram depicting 6-input LUT.

For an implementation in FPGA 100 of FIG. 1, it should be understood that 6-input LUTs may be used. Accordingly, 3 AND gates may be implemented along with a 3-input XOR gate in a single LUT. Thus for example, C0 through C2 bits may be ANDed respectively with EC0 through EC2 bits for providing three outputs to a 3-input XOR gate. For this implementation, 15 LUTs may be used. Of the 15 LUTs, 11 LUTs may be used for the 32 ANDed checksum and enable checksum bits and a first level of XORing, where three AND results are XORed at a time, as generally indicated in FIG. 12. The output of the XOR gates in this first stage of processing may be provided to three 6-input LUTs, namely LUTs 12 through 14 (not shown). The output of LUTs 12 through 14 may be input to another 6-input LUT, namely LUT 15 (not shown), for producing an output result. Likewise, LUTs may be used to implement data and enable data ANDing and XORing of bits.

FIG. 10 is a block diagram depicting an exemplary embodiment of an enable data function generator 1000, and FIG. 11 is a block diagram depicting an exemplary embodiment of an enable checksum function generator 1100. Enable function generators 1000 and 1100 are in activation logic block 310 of FIG. 3.

Enable function generator 1000 generates enable/disable signals for enable data bits. Enable checksum generator 1100 generates enable/disable signals for accumulated CRC bits. Inputs on the left side of each of generators 1000 and 1100 are the 16 decodes of a 4-bit data width bus, namely width input 202 of FIG. 3. Generators 1000 and 1100 may include hard- or soft-coded enable and disable information, which may be specific to a particular polynomial, maximum data width, or optional remainder, or a combination thereof, as may vary from application to application.

Because each of cones 303 of FIG. 3 is a repeated instance that may be configured to perform both AND and XOR functioning for a number of CRC bits and for a selected data width, configuring of activation logic block 310 involves selecting which enables are enabled and which enables are disabled for enable data buses and enable checksum buses. A first layer of logic in each of cones 303 is for AND gating, as previously described. These AND gates may be grouped into those that have data bits, such as a data input portion, and another portion that have bits of an accumulated CRC, such as a checksum portion. For an unconfigured cone, all enable bits, both checksum and data enable bits, may be set to logic 0 for which XORing results in a nullity. It should be understood that enable bits allow some data and some accumulated CRC bits to be activated to calculate a specific CRC function, namely generally to be included in a bitwise XOR calculation.

Depending on application, enable bits may tie enable inputs of AND gates. For example, a logic 0 input at a bit position to an AND gate may indicate that that bit position is not active, and a logic 1 input at such bit position to such an AND gate may indicate that that bit position is active. A function of the width vector, in addition to selecting all or a portion of a data input bus as being active, is also to select all or a portion of each enable bus as being active.

Again, equations for a set of cones include ANDing and XORing of some or all of the data bits and some or all of the accumulated CRC bits with each other. An output bus, such as result output 250 of FIG. 3, indicates whether there is an even or odd number of logic 1s being input, as allowed by a setting of enable bits. A setting for enable bits may be generated using an HDL file with embedded code, for example EJava code, that has all equations for CRC bits for all data widths, such as 32 CRC bits for all 16 possible data widths in the above example. Thus parameters entered by a user may cause such code to customize an HDL file for a specific CRC formula.

Accordingly, it should be understood that a CRC generator has been described. Even though a 32-bit CRC generator has been described, it should be understood that other polynomials and/or other data widths may be used. Furthermore, even though the data widths have been described as 1 through 16 bytes, smaller or larger data width ranges may be implemented in accordance with the description herein. Additionally, because of the adaptability or versatility of the CRC generator described herein, it may be implemented in field programmable logic gates, or it may be implemented as a hard block as it is easily configured for adaptation to various user parameters.

Furthermore, it should be understood that fewer gates than a prior CRC generator described herein are used and that the CRC generator described herein may run faster than the prior CRC generator described herein as it avoids a multiplexing stage. Additionally, it should be understood that the description of a CRC function herein, namely the topology of such a CRC generator, facilitates logic optimization by implementation tools, namely significantly trimming disabled logic by enable buses. Moreover, avoidance of a multiplexing stage means that such CRC generator as described herein is more suited for a pipelined implementation.

While the foregoing describes exemplary embodiment(s) in accordance with one or more aspects of the invention, other and further embodiment(s) in accordance with the one or more aspects of the invention may be devised without departing from the scope thereof, which is determined by the claim (s) that follow and equivalents thereof. Claim(s) listing steps do not imply any order of the steps. Trademarks are the property of their respective owners.

What is claimed is:

1. A method for error checking in an integrated circuit, comprising:
bitwise ANDing checksum bits and checksum enable bits to provide interim checksum outputs;
XORing the interim checksum outputs to provide resultant checksum outputs;
bitwise ANDing data bits and data enable bits to provide interim data outputs;
XORing the interim data outputs to provide resultant data outputs; and
bitwise XORing the resultant checksum outputs and the resultant data outputs to provide first parity outputs.

2. The method according to claim 1, further comprising:
obtaining a cyclic redundancy check ("CRC") polynomial;
obtaining a width vector; and
selectively activating and deactivating enable bits of enable buses for providing the checksum enable bits and the data enable bits.

3. The method according to claim 2, further comprising:
feeding back the first parity outputs as the checksum bits for another iteration of the method to produce second parity outputs.

4. The method according to claim 3, wherein only a portion of the enable buses are activated responsive to the width vector being for a subset of a data input bus associated with the data bits.

5. The method according to claim 3, wherein a multiplexing stage to select the first parity outputs is not present.

6. The method according to claim 2, further comprising:
instantiating each of the steps of the method of claim 1 in field programmable logic gates; and
coding settings for the enable bits.

7. The method according to claim 6, further comprising:
altering a hardware description language ("HDL") file responsive to parametric input provided to embedded code for a CRC formula;
generating the settings for the enable bits with the HDL file; and
the HDL file having all equations for CRC bits for various data widths.

8. A circuit for cyclic redundancy checking, comprising:
an input data bus coupled to cyclic redundancy check ("CRC") blocks;
each of the CRC blocks coupled to receive all bits of the input data bus;
a checksum bus coupled to the CRC blocks;
each of the CRC blocks coupled to receive all bits of the checksum bus;
an activation logic block configured responsive to a CRC format;
the activation logic block coupled to receive a width vector and configured to activate and deactivate enable bits of enable buses responsive to the width vector and the CRC format;
the activation logic block sourcing the enable buses responsive to bit position;
each of the enable buses having different bit settings for respectively providing to the CRC blocks according to bit position; and
the CRC blocks each being a logical replica of one another.

9. The circuit according to claim 8, wherein the CRC blocks each have an AND input logic stage followed by an XOR tree.

10. The circuit according to claim 9, wherein:
the enable buses each have a checksum enable bus portion and a data enable bus portion;
the checksum enable bus portion of each of the enable buses coupled to a first portion of the AND input logic stage of the CRC blocks for respectively bitwise ANDing with the checksum bus for producing interim checksum bits; and
the data enable bus portion of each of the enable buses coupled to a second portion of the AND input logic stage of the CRC blocks for respectively bitwise ANDing with the input data bus for producing interim data bits.

11. The circuit according to claim 10, wherein the XOR tree is coupled for bitwise XORing the interim checksum bits and the interim data bits to provide checksum bits for the checksum bus.

12. The circuit according to claim 11, wherein the AND input logic stage and the XOR tree for each of the CRC blocks are instantiated in field programmable logic gates.

13. The circuit according to claim 12, wherein the AND input logic stage and the XOR tree for each of the CRC blocks are instantiated using only look-up tables ("LUTs").

14. The circuit according to claim 8, wherein a multiplexer stage coupled to receive the width vector is not present.

* * * * *